US012578405B2

(12) United States Patent
Zeller et al.

(10) Patent No.: US 12,578,405 B2
(45) Date of Patent: Mar. 17, 2026

(54) COMPUTER-IMPLEMENTED METHOD FOR OPERATING A MAGNETIC RESONANCE FACILITY, MAGNETIC RESONANCE FACILITY, COMPUTER PROGRAM AND ELECTRONICALLY READABLE DATA CARRIER

(71) Applicant: Siemens Healthineers AG, Forchheim (DE)

(72) Inventors: Mario Zeller, Erlangen (DE); Flavio Carinci, Würzburg (DE); Dominik Paul, Bubenreuth (DE)

(73) Assignee: Siemens Healthineers AG, Forchheim (DE)

( * ) Notice: Subject to any disclaimer, the term of this patent is extended or adjusted under 35 U.S.C. 154(b) by 194 days.

(21) Appl. No.: 18/599,637

(22) Filed: Mar. 8, 2024

(65) Prior Publication Data

US 2024/0302468 A1    Sep. 12, 2024

(30) Foreign Application Priority Data

Mar. 10, 2023    (DE) ..................... 10 2023 202 163.3

(51) Int. Cl.
*G01V 3/00* (2006.01)
*G01R 33/483* (2006.01)
*G01R 33/561* (2006.01)

(52) U.S. Cl.
CPC ...... *G01R 33/4835* (2013.01); *G01R 33/5611* (2013.01); *G01R 33/5617* (2013.01)

(58) Field of Classification Search
CPC .............. G01R 33/287; G01R 33/4835; G01R 33/5608; A61B 2090/374
(Continued)

(56) References Cited

U.S. PATENT DOCUMENTS

| | | |
|---|---|---|
| 2019/0049541 A1 | 2/2019 | Carinci et al. |
| 2019/0094321 A1* | 3/2019 | Carinci .............. G01R 33/4822 |
| 2020/0166594 A1* | 5/2020 | Carinci ............ G01R 33/56509 |

FOREIGN PATENT DOCUMENTS

| | | |
|---|---|---|
| EP | 3441781 A1 | 2/2019 |

OTHER PUBLICATIONS

Zhang L. et al.: "HASTE Sequence with Parallel Acquisition and T2 Decay Compensation: Application to Carotid Artery Imaginq," Magnetic Resonance Imaging, Elsevier Science, Tarrytown, NY, US; vol. 27, No. 1; published: 2009; pp. 13-22; XP025799153.
(Continued)

*Primary Examiner* — Walter L Lindsay, Jr.
*Assistant Examiner* — Frederick Wenderoth
(74) *Attorney, Agent, or Firm* — Banner & Witcoff, Ltd.

(57)    ABSTRACT

A computer-implemented method for operating a magnetic resonance facility for recording a magnetic resonance data set may include, after the recording of all the reference data, before the establishment of the calibration data, an intensity adjustment of the reference data with respect to the different temporal position of time portions in which they were recorded is performed for the recording of the associated slice scan data. The intensity adjustment may include establishing a representative intensity value for each reference data set of a slice, forming an intensity progression for each time portion from the intensity values of the reference data sets recorded in the time portion, establishing a scaling of the intensity progressions relative to one another, and performing the intensity adjustment based on the scaling.

13 Claims, 6 Drawing Sheets

(58)  Field of Classification Search

USPC ......................................................... 324/309

See application file for complete search history.

(56)                        References Cited

OTHER PUBLICATIONS

Griswold M. et al.: "Generalized Autocalibrating Partially Parallel Acquisitions (GRAPPA)," Magnetic Resonance in Medicine, vol. 47, pp. 1202-1210, 2002 // DOI 10.1002/mrm.10171.

* cited by examiner subdivide slice stack — S1 excite two slices at the same time — S2 record the generated resonance signals — S3 record reference data sets — S4 additional sets? — S5 intensity adjustment of reference data — S6 create calibration data from ref. data — S7 separate the slice scan data — S8 reconstruct image data — S9

FIG 9

COMPUTER-IMPLEMENTED METHOD FOR OPERATING A MAGNETIC RESONANCE FACILITY, MAGNETIC RESONANCE FACILITY, COMPUTER PROGRAM AND ELECTRONICALLY READABLE DATA CARRIER

CROSS REFERENCE TO RELATED APPLICATIONS

This patent application claims priority to German Patent Application No. 10 2023 202 163.3, filed Mar. 10, 2023, which is incorporated herein by reference in its entirety.

BACKGROUND

Field

The disclosure relates to a computer-implemented method for operating a magnetic resonance facility for recording a magnetic resonance data set of an examination region of an examination object subdivided into slices of a slice stack by means of a parallel recording technique. In addition, the disclosure relates to a magnetic resonance facility, a computer program and an electronically readable data carrier.

Related Art

Magnetic resonance imaging has become a well-established imaging modality, in particular, in the medical field. Expressed in a simplified form, nuclear spins of the examination object, in particular a patient, are subjected in the examination region to the most homogeneous possible strong main magnet field, in which they become aligned. The nuclear spins can be excited by radiofrequency excitation pulses, wherein the decay of this excitation can be measured as magnetic resonance signals. The excitation can therein also be described as a manipulation. In order to achieve a spatial resolution, typically spatially encoded gradient pulses of a gradient pulse arrangement are used. For example, by way of what are known as slice selection gradient pulses, it is possible to restrict the excitation and/or, in general a manipulation, to particular slices in the examination region.

A significant problem in magnetic resonance imaging, for which a large number of solution approaches exist, is the often long recording time until data is available from the whole of the examination region. A known solution approach is what is known as SMS (simultaneous multislice) imaging which can also be referred to as multislice imaging and/or slice multiplexing. Herein, what is known as a multiband excitation pulse is used in order to excite two or more slices simultaneously. Accordingly, multiband refocusing pulses and multiband saturation pulses can be used to manipulate the slices simultaneously by other means, for example to refocus and/or saturate them. In general terms, a multiband radiofrequency pulse of this type can be understood as a multiplex of individual radiofrequency pulses which would be used for manipulating the individual slices that are to be manipulated simultaneously. By way of the multiplexing, for example, a baseband-modulated multiband radiofrequency pulse is obtained from an addition of the pulse forms of the individual radiofrequency pulses. The spatial encoding of the recorded magnetic resonance signals can therein be achieved by means of a commonly-used gradient switching in two directions (two-dimensional gradient encoding). Multiband radiofrequency pulses, in particular the multiband excitation pulse, are spatial in their effect and are restricted to the desired slices.

By way of the simultaneous recording of the magnetic resonance signals from all the excited slices, a slice scan data set is created in which the magnetic resonance signals from all the excited slices are contained compressed. Parallel acquisition techniques such as GRAPPA ("Generalized Autocalibrating Partially Parallel Acquisition") or SENSE ("Sensitivity Encoding") can be used in order to distribute the slice scan data set into single slice scan data sets of the at least two slices. Herein finally, coil sensitivity data of the radiofrequency coils (receiving coils) used in the recording is used. In order to be able to establish this coil sensitivity data, which can also be designated calibration data, reference data is required which samples at least one region of the k-space to be scanned, typically the central region, completely in accordance with the Nyquist condition.

The use of SMS imaging has been extended recently to ever more types of magnetic resonance sequences. It is particularly suitable in this context if, for further acceleration of the imaging procedure, the SMS imaging is combined with "accelerated" magnetic resonance sequences.

An example for such magnetic resonance sequences are the turbo spin echo (TSE) sequences which are also known under the name FSE (fast spin echo) or RARE (Rapid Acquisition with Refocused Echoes). In a TSE sequence, following an excitation pulse, a plurality of refocusing pulses are output and thus a plurality of echo signals is generated so that the data recording is accelerated. A special case of the TSE sequence is what is known as the HASTE sequence (Half-Fourier Acquisition Single-Shot Turbo Spin Echo) which belongs to what are known as single-shot methods. Herein, the overall k-space data to be recorded is acquired after a single excitation pulse, in particular by way of repeated refocusing. For further acceleration by reducing the k-space data to be recorded, in HASTE sequences, a "partial Fourier" method, in particular the half-Fourier method, is utilized. Herein, the symmetry of the k-space as compared with complex conjugation is used in order to derive non-measured k-space data from the measured k-space data. HASTE recording techniques are known under the acronyms SS-FSE (Single-Shot Fast Spin Echo), SSH-TSE (Single-Shot Turbo Spin Echo), UFSE (Ultra-Fast Spin Echo), Single-Shot Fast SE or FASE and/or Super-FASE (Fast Advanced Spin Echo).

Depending upon the duration of the repetition time and the number of the desired slices to be recorded in the examination region, the total recording time on use of the HASTE technique is, however, above the typical breath-holding capability of patients. Therefore, the recording without further acceleration must often be carried out with a plurality of breath holds. This can sometimes be burdensome for patients. Furthermore, a displacement of the slices recorded in different breath holding periods can occur. It has therefore been proposed to make SMS imaging usable also for HASTE sequences, in order to enable a recording within one breath holding period. However, SMS imaging requires, as stated, the recording of reference data for each individual slice. If the recording takes place by means of a preceding reference scan, the aforementioned problem often occurs due to different breath layers and thus non-coincident slice stacks between the reference scan and the imaging scan.

In this regard, in EP 3 441 781 A1, an accelerated magnetic resonance scan was proposed that is applicable to the SMS-HASTE combination which reduces movement-sensitivity and can easily be integrated into existing reconstruction pipelines. Specifically, therein, to enable a combination of single-shot methods with the advantages of slice multiplexing without quality loss, it is proposed to record the reference data such that between the recording of the slice scan data of the slice scan data set and its associated reference data, no slice scan data of another slice scan data set can be recorded. In this way, a high degree of robustness in relation to movements of the examination object is achieved. Due to the temporally closely adjacent recording of, firstly, the reference data and, secondly, the associated slice scan data, the reference data is inherently recorded in a similar movement state of the examination object as the slice scan data, so that artifacts which occur in different movement states for reference data and slice scan data can be avoided. This is advantageous, in particular, in connection with single-shot methods which are otherwise particularly prone to movement-induced artifacts.

Thereby, the advantages of slice multiplexing methods which require a recording of reference data can be combined with the advantages of single-shot techniques. In the context of recording procedures, in particular, which require breath-holding by the patient, this is particularly advantageous. In a particularly advantageous embodiment, the reference data is recorded subsequently to the recording of the slice scan data.

However, it is herein problematic that the reference data (to be recorded separately for the plurality of slices, that is, one after another) is recorded in different time portions of the recording procedure that have a different temporal spacing from the imaging scan, that is, the recording of the slice scan data, so that a different relaxation behavior results. This leads to a slightly altered contrast in the reference data which can negatively influence the final quality and/or can lead to slice cross-talk and/or incompletely suppressed aliasing.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 9 shows a controller of the magnetic resonance facility according to an exemplary embodiment of the disclosure.

Figures 1, 2:
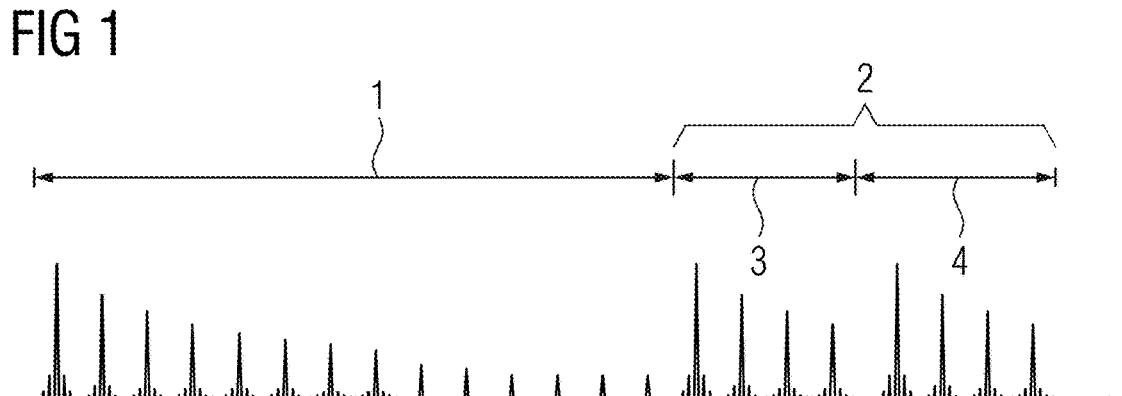
FIG. 1 shows schematically magnetic resonance signals during an SMS imaging procedure of a group of slices and a directly subsequent recording of reference data, according to an exemplary embodiment of the disclosure.
FIG. 2 shows a flowchart of a method according to an exemplary embodiment of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to provide a possibility for using the reference scan recording principle leading to an improved image quality, in which, between the recording of the slice scan data of the slice scan data set and the subsequent recording of its associated reference data, no scan data is recorded from slices that are not included in the at least two slices of the slice scan data set.

This object is achieved according to the disclosure by providing a computer-implemented method, a magnetic resonance facility, a computer program and an electronically readable data carrier according to the disclosure.

According to the disclosure, a computer-implemented method for operating a magnetic resonance facility for recording a magnetic resonance data set of an examination region of an examination object subdivided into slices of a slice stack using a parallel recording technique, the slices following one another in an arrangement direction in a spatial sequence, may include:

distributing the slice stack into groups, each having the same number of at least two non-overlapping slices, and for each group:

simultaneously exciting the at least two slices of the group by means of a multiband excitation pulse, recording the magnetic resonance signals that are generated by the multiband excitation pulse from the at least two slices of the group as a slice scan data set, separate recording, following the recording of the slice scan data set, of reference data of the at least two slices of the group in a recording procedure such that the central region of the k-space filled by the slice scan data and the reference data is sampled completely and that, between the recording of the slice scan data of the slice scan data set and the recording of its associated reference data, no scan data is recorded from slices which are not included in the at least two slices of the slice scan data set, establishing calibration data from the reference data, separating the slice scan data into single slice scan data sets of the at least two slices of the group, making use of the calibration data, and reconstructing image data of the magnetic resonance data set from the single slice scan data sets, wherein for the recording of the reference data for each slice of a group, a different time portion of the recording procedure is used, wherein the time portions have different temporal spacings from the multiband excitation pulse.

In such a method in which the reference data is recorded following the recording of the slice scan data, in an exemplary embodiment, after the recording of all the reference data, before the establishment of the calibration data, an intensity adjustment of the reference data with respect to the different temporal positions of time portions relative to the multiband excitation pulse takes place, by:

a representative intensity value being established for each reference data set of a slice, an intensity progression for each time portion being formed from the intensity values of the reference data sets recorded in the time portion, a scaling of the intensity progressions relative to one another being established, and the intensity adjustment taking place on the basis of the scaling.

This proceeds from a variant of the procedure described in EP 3 441 781 A1, wherein the reference data is recorded following the recording of the slice scan data of the SMS imaging, although again without slice data from other slices, specifically another group, being captured therebetween. In this way, a high degree of basic robustness in relation to movements of the examination object is already achieved. Simply as a result of the temporally closely adjacent recording of, firstly, the reference data and, secondly, the associated slice scan data, movement artifacts can be prevented and/or reduced, wherein also in the context of the present disclosure, particularly advantageously, a single-shot method, in particular a single-shot TSE method for recording the slice scan data is particularly preferred. This means that the slice scan data can preferably be recorded with a single-shot technique. Herein, in particular, following a single multiband excitation pulse, the whole of the k-space that is to be sampled is sampled, which means that all the magnetic resonance signals from the slices of the group are acquired as a slice scan data set following the one, single multiband excitation pulse. In particular, a HASTE technique can be used as a single-shot technique. Herein, it is also preferred if the slice scan data is recorded according to a CAIPIRINHA method. These procedures are, in principle, known from the prior art, for example, from EP 3 441 781 A1 with further references, and need not be set out in detail again here.

According to the disclosure, it has now been recognized that due to the different position of the time portions and thus of the recording of the reference data for the different slices of the group, contrast differences and/or intensity differences can occur, which can lead to image quality impairments. Based upon the concept that in the arrangement direction across the slices, the basic progression of representative intensity values of the reference data should be at least substantially the same despite a difference in the amplitude, it is therefore proposed, for the reference data recorded in the respective time portions (defined relative to the preceding imaging scan), to establish the representative intensity value and for each time portion, to establish an intensity progression in the arrangement direction, that is, in accordance with the spatial sequence. Therein, the number of time portions corresponds to the number of the slices per group. For these intensity progressions, one for each time portion after the imaging scan, scalings are then established relative to one another, which describe the intensity differences.

It has been found that the intensity differences between the progressions are small compared with the absolute values so that the scaling can be described substantially by way of a displacement of the intensity progressions relative to one another.

Following this thought, it can be provided that the intensity progressions are fitted to one another leaving out the zero-order fit parameter for establishing an item of fit information describing the scaling. Preferably, therefore, the intensity progressions are fitted to one another wherein, however, the zero-order fit parameter, known as the axis shift, is left out. In this way, the intensity progressions simply becoming shifted relative to one another is avoided and thus the desired, sought-for information-specifically the shift and therefore intensity scaling-becomes lost. The result of the fit is therefore parallel-extending fit progressions, described by way of the same fit parameters as far as the zero-order fit parameters, which differ by way of a scaling factor. Therefore, for intensity adjustment, a scaling factor for reference data sets to be adapted can be established from a corresponding item of fit information describing the scaling, wherein herein one of the time portions is used as a reference time portion, for example, the first time portion or the time portion with the highest intensity (and therefore axis shift). For reference data sets of the reference time portion, a multiplication of the reference data with the scaling factor is therefore not necessary.

In principle, intensity progressions can be described by way of suitable functions that can be selected suitably for a fit algorithm that is to be used. For example, it is conceivable to describe the intensity progressions polynomially; in other cases, it can also be useful to use B-splines. In principle, fitting methods known from the prior art can be used. It is suitable that the fit takes place such that the fit parameters are the same for all intensity progressions except for the axis shift.

Herein, it can occur in some examination regions that an intensity jump occurs from one slice of the slice stack to the next, for example because a tissue change and/or in general a boundary surface extends perpendicularly to the arrangement direction. In order to configure the fitting procedure more robustly in this context, a particularly advantageous embodiment of the present disclosure provides that before the fitting, an item of intensity jump information describing intensity jumps along the arrangement direction is established from the slice scan data and is considered during the fitting. For example, a first preliminary reconstruction of magnetic resonance images of the slices can take place, for example, on the basis of the as yet uncorrected reference data, and at least estimated expected intensity progressions can also be used in the fit. In this way, the robustness of the procedure according to the disclosure and the image quality enhancement can be improved.

As far as the representative intensity value is concerned, this can be established by way of averaging of a part of the reference data of the respective reference data set. For example, this averaging can be carried out across all the reference data, although it is also possible, for example, to restrict the averaging to the central k-space line. Thereby, a representative intensity for each reference data set is obtained easily and reliably.

Overall, it can therefore be stated that with the procedure disclosed, a deviation of the relative intensities from simultaneously excited slices between the reference and imaging scans, that is, the recording of the slice scan data and image artifacts associated therewith, can be avoided during SMS imaging.

The establishment of the scaling, in particular by way of a fitting procedure, is herein possible in a significantly better manner, the better the intensity progressions cover the slice stack in the arrangement direction. Therefore, a particularly preferred development of the present disclosure provides that an at least best-possible uniform distribution of the intensity values in the arrangement direction is generated across the slice stack, by, for at least a pair of groups, the assignment of the temporal sequence of the recording of their reference data to their spatial sequence being selected to be different. It is therefore proposed to adapt the sequence of the excited slices for the reference scan such that finally the reference data sets are recorded in the spatial sequence of the arrangement direction alternatingly with respect to the different time portions. For example, a time portion sequence can be provided which is given in the spatial sequence of the slices in the arrangement direction by way of the reference data sets. In the simple case of groups of two slices each, an optimal solution can be provided, with regard to the establishment of the scaling, in that in the arrangement direction, the reference data for the slices is always recorded alternatingly in another of the two time portions of the recording procedure. However, it can certainly also occur herein (as considered in more detail below), due to the requirements for minimizing slice cross-talk, that the best-possible uniform distribution requires two mutually adjacent slices, the reference data of which has been recorded in the same time portion, for example, centrally along the arrangement direction.

Specifically, it can be provided, for example, that for distribution into groups firstly, an even distribution of the slice stack into a number of coherent stack portions corresponding to the number of slices to be excited simultaneously takes place, whereafter the groups are formed according to the spatial sequence in the stack portions progressively with respectively one slice from each stack portion.

Thus, within each group there is an equal, greatest possible spacing between slices to be excited simultaneously. The sequence of the recording of these groups, is then selected at least so that in sequential groups, a greatest possible spacing also exists between excited slices in order further to avoid slice cross-talk. It is now proposed, for establishing the temporal sequence of the recording of the reference data, to distribute the slices of the stack portions as evenly as possible among the time portions. If the spatial sequence were to be simply followed, this would have the result that a time portion would be associated with each stack portion, which could make a successful fitting procedure more difficult. It is therefore now proposed to select the sequence of the recording of the reference data in the recording procedure for the different groups so that ideally for each stack portion, reference data sets for all the time portions are available distributed as equally as possible.

Specifically, in this regard, it can be provided that for two slices to be simultaneously excited given an odd number of groups, for groups containing slices that are spatially directly adjacent in each case, with regard to the stack portions, inverted temporal sequences are selected, and given an even number of groups, the temporal sequences are selected so that two slices with the same time portion of the recording of the reference data are situated in the middle of the slice stack.

If, in a specific example, ten slices with an SMS acceleration factor of two, that is two slices per group, are recorded, after numbering the spatial sequence in the slice stack, the groups (slice 1, slice 6), (slice 2, slice 7), (slice 3, slice 8), (slice 4, slice 9) and (slice 5, slice 10) result. The reference data for slice 1 is then recorded in the first time portion, the reference data of slice 6 is consequently recorded in the second time portion. For the slices 2 and 7, the reverse time sequence applies: the reference data of slice 7 is recorded in the first time portion, the reference data of slice 2 is recorded in the second time portion. For slice 3, the reference data is again recorded in the first time portion, for slice 8 in the second time portion, etc. There then results, over the time stack in the arrangement direction, that is, in the spatial sequence, an alternating assignment to the two time portions, so that intensity progressions arise for both time portions which eventually cover the entire slice stack and thus permit a robust and high-quality establishment of the scaling. In this specific example, the slice number in the slice stack divided by the acceleration factor, that is, the number of slices per group, is odd. With an even result, as distinct from a meeting of slices with the same time portion of the reference data in the center of the slice stack, which however still enables excellent robust establishing procedures, in particular fitting procedures.

Summarizing, a uniform distribution of the excited slices is therefore proposed for the recording of the reference data sets, after which intensity differences can be normalized.

The intensity-adjusted reference data sets are then used, as is known in principle from the prior art, in order to establish calibration data by means of which the slice scan data can be separated into single scan data sets of the simultaneously excited slices. For example, a slice-GRAPPA algorithm can be used here. It should be noted that the calibration data can also be further used even in the reconstruction of image data of the magnetic resonance data set from the single slice scan data sets if an undersampling has been carried out, specifically for completing the single slice scan data sets.

Besides the method, the disclosure also relates to a magnetic resonance facility with a controller. The controller may include:

a distribution unit for distributing a slice stack of slices which cover an examination region of an examination object into groups, each having the same number of at least two non-overlapping slices, wherein in the slice stack, the slices follow one another in a spatial sequence in an arrangement direction, a recording unit for: simultaneously exciting the at least two slices of the group by means of a multiband excitation pulse, recording the magnetic resonance signals that are generated by the multiband excitation pulse from the at least two slices of the group as a slice scan data set, and the separate recording, following the recording of the slice scan data set, of reference data of the at least two slices of the group in a recording procedure such that the central region of the k-space filled by the slice scan data and the reference data is sampled completely and that, between the recording of the slice scan data of the slice scan data set and the recording of its associated reference data, no scan data is recorded from slices which are not included in the at least two slices of the slice scan data set, wherein for the recording of the reference data for each slice of a group, a different time portion of the recording procedure is used, wherein the time portions have different temporal spacings from the multiband excitation pulse, an adjustment unit for intensity adjustment of the reference data with regard to the different position of the time portions in relation to the multiband excitation pulse, by:

a representative intensity value being established for each reference data set of a slice, an intensity progression for each time portion being formed from the intensity values of the reference data sets recorded in the time portion, a scaling of the intensity progressions relative to one another being established, and the intensity adjustment taking place on the basis of the scaling, a calibrating unit for establishing calibration data from the reference data, a separating unit for separating the slice scan data set into single slice scan data sets of the at least two slices of the group, making use of the calibration data, and a reconstruction unit for reconstructing image data of the magnetic resonance data set from the single slice scan data sets.

In other words, the controller of the magnetic resonance facility may be configured to carry out the method according to the disclosure. One or more of the embodiments of the method according to the disclosure can be transferred similarly to the magnetic resonance facility according to the disclosure with which the advantages mentioned above can therefore also be obtained.

In particular, the controller can comprise at least one processor and at least one memory storage means. The functional units described can be implemented by way of hardware and/or software, wherein the recording unit can also be designated the sequence unit since it suitably implements magnetic resonance sequences. Naturally, in view of further embodiments of the present disclosure, further functional units can also be realized by the controller.

A computer program according to the disclosure is able to be loaded directly into a memory storage means of a controller of a magnetic resonance facility and has program means such that when the computer program is executed on the controller of the magnetic resonance facility, the magnetic resonance facility carries out the method according to the disclosure. The computer program can be stored on an electronically readable data carrier which therefore comprises control information stored thereon, which comprises a computer program according to the disclosure and is configured such that, on use of the data carrier in a controller of a magnetic resonance facility, it causes them to carry out the method according to the disclosure.

In the following, exemplary embodiments are considered making reference to an SMS acceleration factor of two, that is, in each case two simultaneously recorded slices of a group by way of example. The acceleration factor is not limited, and the described subject matter can also be transferred to larger SMS acceleration factors.

Therein, an examination region of an examination object, in particular a patient, is to be recorded with a total recording time that is as fast as possible, wherein the examination region is subdivided into slices of a slice stack which follow one another in an arrangement direction in a spatial sequence. In order to accelerate the recording of the magnetic resonance data set, firstly, an SMS imaging process is utilized, wherein the slice stack is divided into groups of two slices each which are excited simultaneously with a multiband excitation pulse in order to record collapsed slice scan data. Secondly, however, a single-shot technique, in the present case, by way of example, a HASTE technique, is used which means that the entire k-space to be sampled is captured using refocusing pulses after the single multiband excitation pulse. In other words, after a single multiband excitation pulse, in a single imaging procedure, the entire collapsed slice scan data set for a group is recorded. Directly thereafter follows, as described, for example, in EP 3 441 781 A1, the recording of reference data sets for the two slices in order to keep movement effects as small as possible.

FIG. 1 shows, using the example of one group, schematic magnetic resonance signals against time T. Therein, the slice scan data is recorded in an imaging time portion 1 wherein, as has been set out, the k-space is entirely filled. Thereafter, there follows a recording procedure 2 for the reference data of the two slices for which the slice scan data has been captured in the imaging time portion 1. The recording procedure 2 is subdivided into two equal-length time portions 3, 4 which are defined relative to the imaging time portion and in which, after a renewed slice-specific excitation pulse, a reference data set is recorded for each of the two different slices. Evidently, the two reference scans in the time portions 3, 4 have a different temporal spacing from the imaging time portion 1 and thus also from the (last and here only) outputting of the multiband excitation pulse and the refocusing pulses, which leads to a different relaxation behavior. This different relaxation behavior results in a slightly altered contrast in the reference data, which can negatively influence the final image quality and can lead to slice cross-talk and/or incompletely suppressed aliasing.

Such effects are to be greatly reduced in the method according to the disclosure described below or even entirely prevented.

For this purpose, FIG. 2 shows a flow diagram of an exemplary embodiment of the method according to the disclosure. Therein, it is assumed that the examination region and its distribution into slices of the slice stack are already known. The steps now described can be carried out automatically by the controller of the magnetic resonance facility used for the recording.

In a step S1, the slice stack is subdivided into groups of at least two non-overlapping slices. In the present case, for this purpose the slice stack is subdivided into two coherent stack portions of the same size, wherein each group is then formed by slices, from the respective stack portions, spaced by the same slice spacing in the arrangement direction. If, therefore, the slice stack has 2n slices, the groups form according to (slice 1, slice n+1), (slice 2, slice n+2), . . . . A recording sequence of the groups is usually also assigned to the groups, which also maximizes the slice spacing between the groups as far as possible.

In this distribution and specification of groups in step S1, it is also already specified in which time portion 3, 4 the reference data for the respective slices of the group should be recorded. Therein, the assignment of time portions to reference data of slices takes place in such a way that a best-possible uniform distribution in the arrangement direction over the slice stack is created. For this purpose, it is required that the assignment of the temporal sequence of the recording of their reference data not correspond to the spatial sequence of the corresponding slices of the group for each group. In the present example of the SMS acceleration factor two, a best possible largely alternating sequence of time portions along the arrangement direction is brought about, provided this is compatible with the avoidance of slice cross-talk during the recording of the slice scan data. In particular, given an even number of groups, the result for the best-possible uniform distribution is then that two slices with the same time portion of the recording of the reference data are situated in the middle of the slice stack. This will be explained in greater detail using specific examples.

The following recording steps each take place for each group. In a step S2, the at least two slices of the group are excited at the same time, that is simultaneously, by means of a multiband excitation pulse. Therein, in the present case, a single-shot technique is to be used, in the present case, specifically, a HASTE sequence. This means, in the now following step S3, by recording the resonance signals that are generated by the multiband excitation pulse, the entire k-space to be sampled is filled from the at least two slices of the group as a slice scan data set.

Immediately thereafter, in step S4, the recording of reference data sets takes place for the just simultaneously excited and sampled slices of the respective group. Therein, the recording of the reference data sets takes place, as already described, separately for each slice in temporally sequential time portions 3, 4 of the recording procedure 2. For the reference data, the central region of the k-space filled by the slice scan data is sampled completely in compliance with the Nyquist condition. Since the recording of the reference data sets directly follows the recording of the slice scan data set for the same slices, between the recording of the slice scan data of the slice scan data set and the recording of its associated reference data, no scan data is recorded from slices which are not included in the two slices of the slice scan data set, that is, from the group.

In step S5, it is tested whether further slice scan data sets for remaining groups are to be recorded and, possibly, a return to step S2 takes place. If slice scan data sets are available for all the groups and the associated reference data sets for all the slices, the process proceeds with step S6, wherein an intensity adjustment of the reference data takes place with regard to the different position of the time portions 3, 4 relative to the multiband excitation pulse and/or the imaging time portion 2.

For this purpose, initially a representative intensity value is established for each reference data set of a slice, that is every slice. For this purpose, in the present case, the reference data of the slice overall is averaged. A representative intensity value can, however, alternatively also be obtained if only the reference data of the central k-space line is averaged.

This scan data arranged for the respective time portions 3, 4 one after the other in the arrangement direction, that is, according to the spatial sequence, results in intensity progressions for each time portion 3, 4. These can each be described by way of a common function, deviating only in the axis shift for each of the intensity progressions, for example, a polynomial or B-splines.

In the present exemplary embodiment, the two intensity progressions are fitted to one another except for the zero-order parameter which relates to the axis shift. This means that a function identical in all fit parameters except for the axis shift (zero-order fit parameter) is determined for all the intensity progressions. In this way, the intensity progressions becoming displaced into one another by the fit is avoided. Thus, after the fitting, two fit progressions exist that are identical with regard to intensity (amplitude) but are displaced against one another, of which one is selected as the reference progression. The axis shifts as fit information describe the shift of the fit progressions relative to one another which approximates to the scaling. A global scaling factor can now be established by the division of the axis shifts of the fit progressions with which the intensity progression not selected as a reference could be multiplied to be situated as exactly as possible on the other intensity progression. This scaling factor can therefore be applied to the reference data of the time portion not used as the reference, in order to achieve the intensity adjustment.

Therein, it should also be noted at this point that, in exemplary embodiments, a prior separation can also take place on the basis of not yet adjusted reference data, in order to obtain information regarding possibly existing intensity jumps from the slice scan data, that is, an item of intensity jump information that is taken into account during the fitting.

Following the intensity adjustment by means of the scaling factor describing the scaling, in a step S7, as known in principle, calibration data is created from the reference data, and in a step S8, the calibration data is used for separating the slice scan data set into single slice scan data sets of the two slices of the group. Herein, for example, a slice GRAPPA algorithm can be used.

Finally, in a step S9, a reconstruction of image data of the magnetic resonance data set from the single slice scan data sets takes place, wherein the calibration data can again be used in order to complete the single slice scan data sets when, in this regard, an undersampling has taken place.

Figure 3:
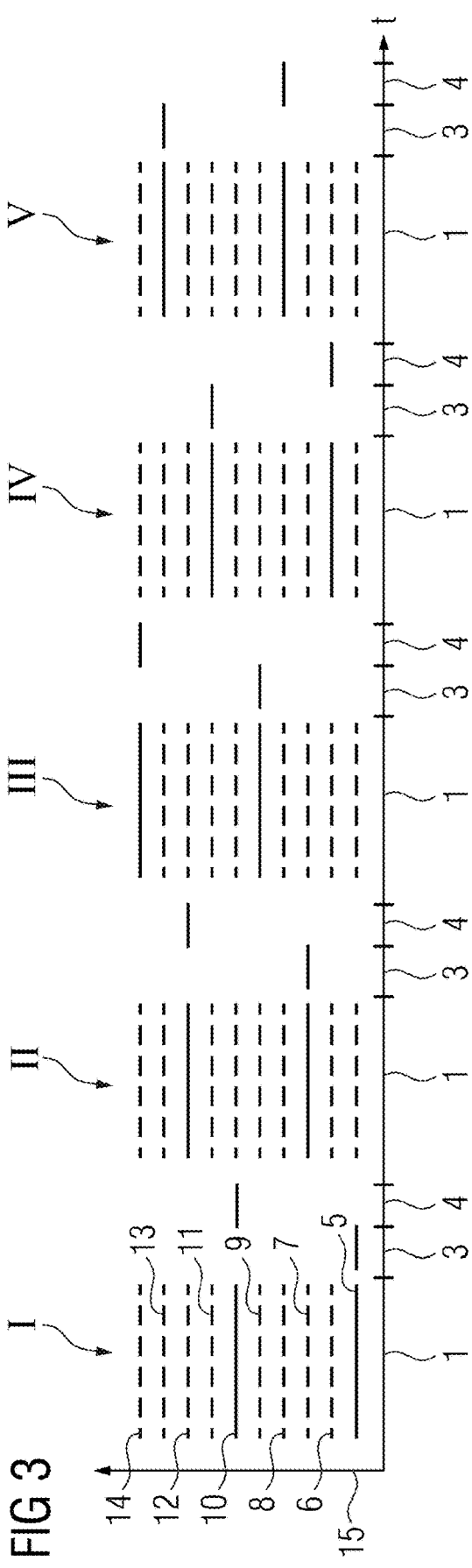
FIG. 3 shows a recording scheme according to an exemplary embodiment of the disclosure.
Figure 4:
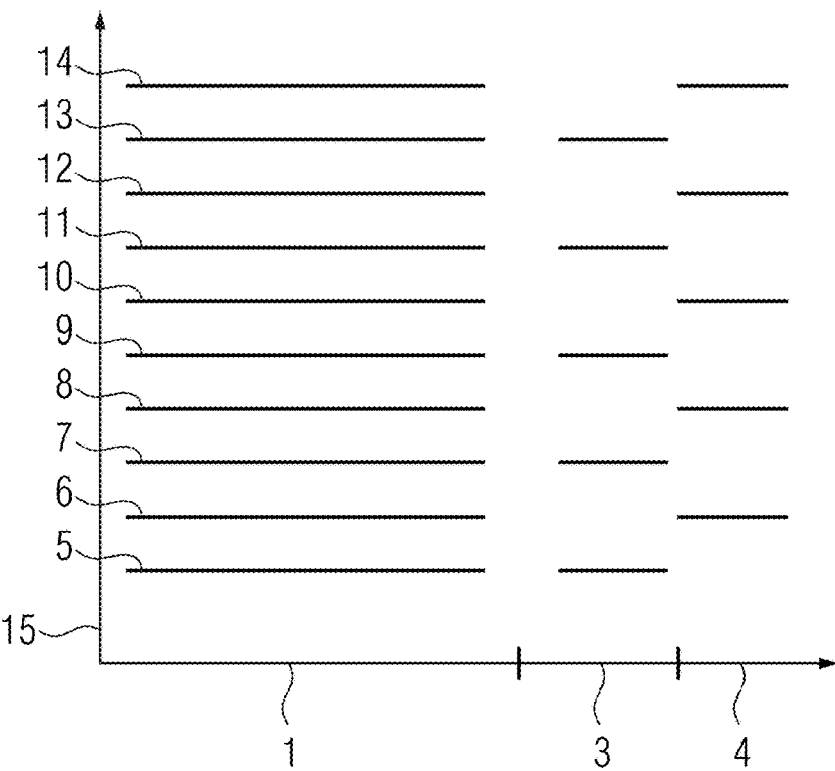
FIG. 4 shows the resulting relative temporal position of recorded data in accordance with the recording scheme of FIG. 3.
Figure 5:
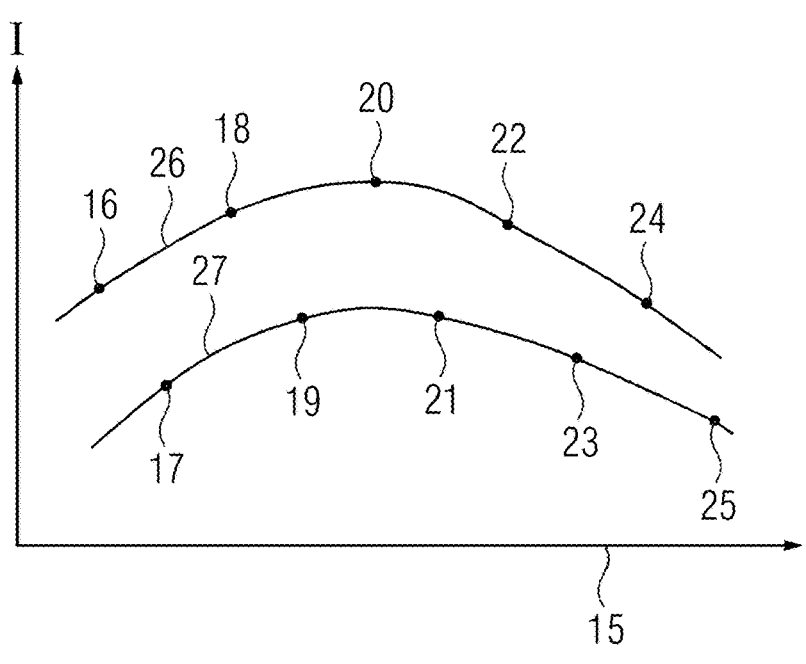
FIG. 5 shows intensity progressions in accordance with the recording scheme of FIG. 3.

FIGS. 3 to 5 illustrate a first specific exemplary embodiment in which the slice stack contains ten slices 5 to 14, which follow one another in the spatial sequence in the arrangement direction 15. FIG. 3 shows a recording scheme for the five groups formed herefrom, wherein slices 5 to 14 of the slice stack recorded in a recording step I to V are shown solid and non-recorded slices are shown dashed. Evidently, in the recording step I, the slices 5 and 10 of a first group, in recording step II, the slices 7 and 12 of a second group, in the recording step III, the slices 9 and 14 of a third group, in the recording step IV, the slices 6 and 11 of a fourth recording group and, in the recording step V, the slices 8 and 13 of a fifth recording group are recorded. Therein, the recording of the reference data in the time portions 3 and 4 of the recording procedure 2 evidently takes place in the recording steps I, II and III according to the spatial sequence of the slices, although in the recording steps IV and V, this is exactly reversed.

The result is shown in FIG. 4 which shows the relative temporal position and thus the relaxation state of the scan within a TR period (repetition time). Evidently, the imaging time portions 1 have the same placing for all groups. For the reference scans of the reference data sets, an alternating distribution to the time portions 3 and 4 results. This means that an even uniform distribution exists.

If the representative intensity values 16 to 25 are now established for the reference data sets of the slices 5 to 14 and if they are plotted against the arrangement direction 15, then intensity progressions 26, 27 result which can be described by way of functions and, evidently, are shifted and/or scaled relative to one another. If now the same function is fitted to both intensity progressions 26, 27, the two functions differ only in their zero-order fit parameters, specifically the axis shift, so that from the division of the axis shifts of both functions, a global scaling factor can be established which can be used for intensity adjustment.

Figure 6:
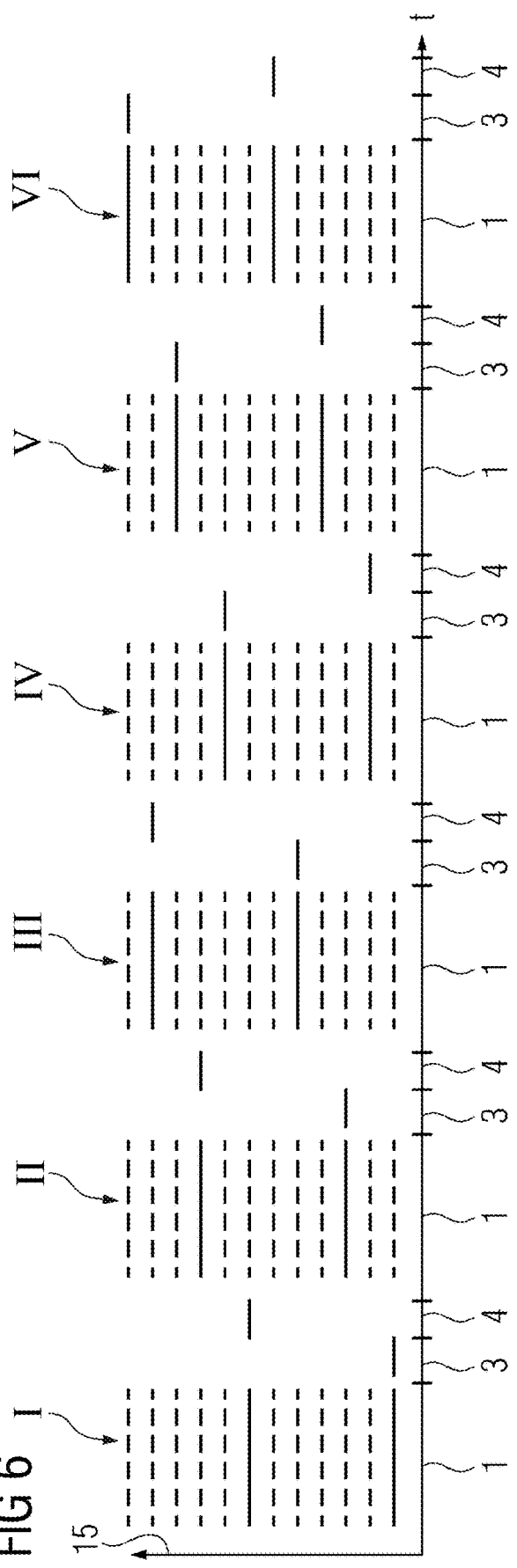
FIG. 6 is a recording scheme according to an exemplary embodiment of the disclosure.
Figure 7:
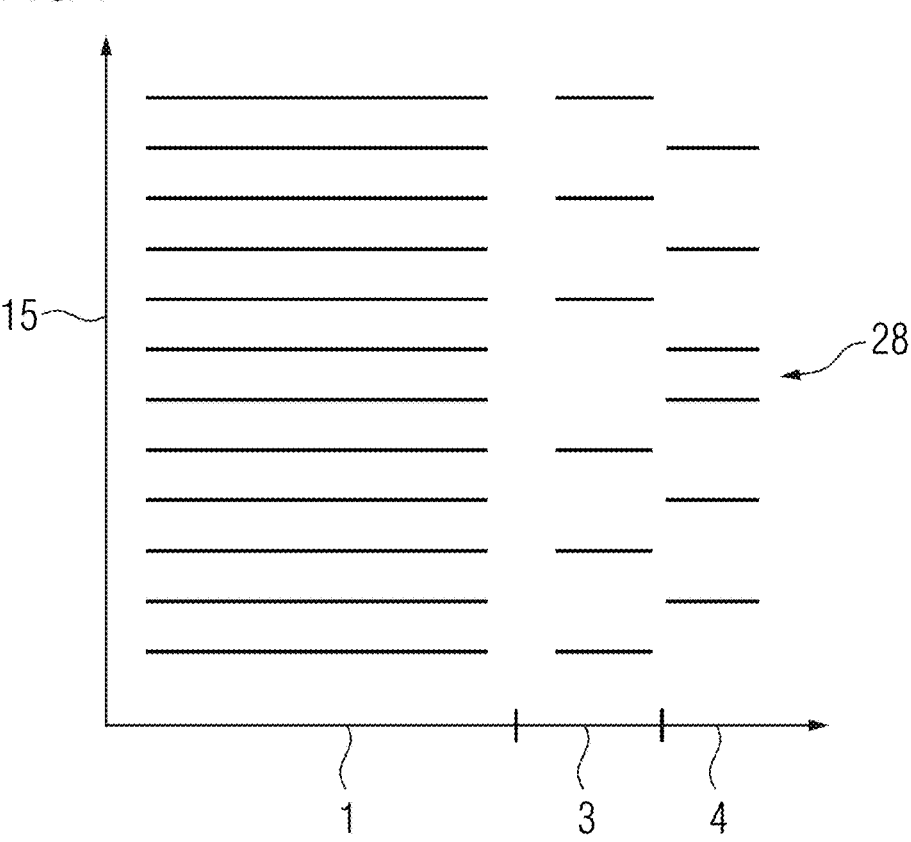
FIG. 7 shows the relative temporal position of recorded data for the second specific example in accordance with FIG. 6.

A second specific example for a slice stack comprising twelve slices is described in relation to FIGS. 6 and 7. In the then resulting recording steps I to VI for the then six groups, the half with the spatial sequence of corresponding temporal sequence, the other half with the contrary temporal sequence is recorded, which has the result, as FIG. 7 shows, that two adjacent slices appear in the middle of the slice stack, the reference data sets of which have both been recorded in the second time portion 4; see reference scan 28. Although in conventional SMS imaging, this situation would be problematic since slice cross-talk could occur, this is, however, not a problem for the reference scan recording in HASTE sequences.

Figure 8:
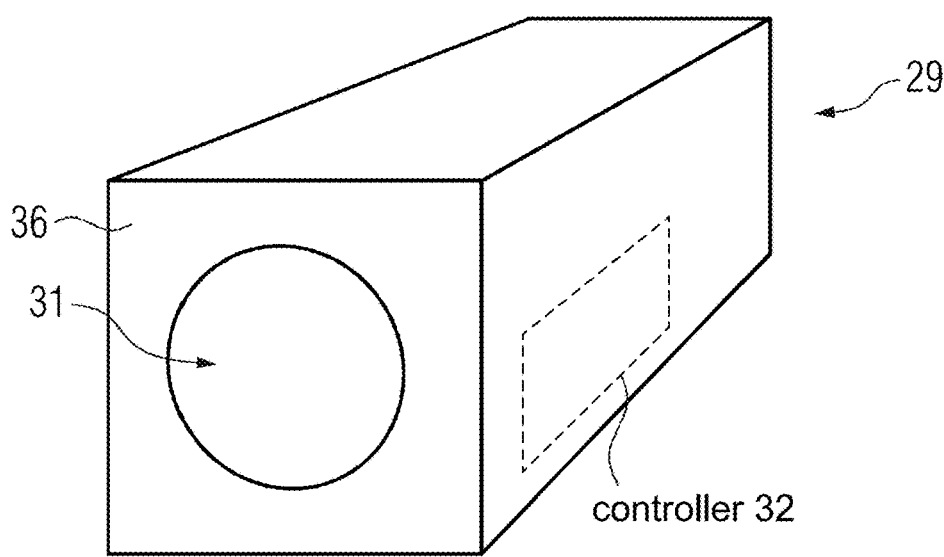
FIG. 8 shows a magnetic resonance facility according to an exemplary embodiment of the disclosure.
Figure 9:
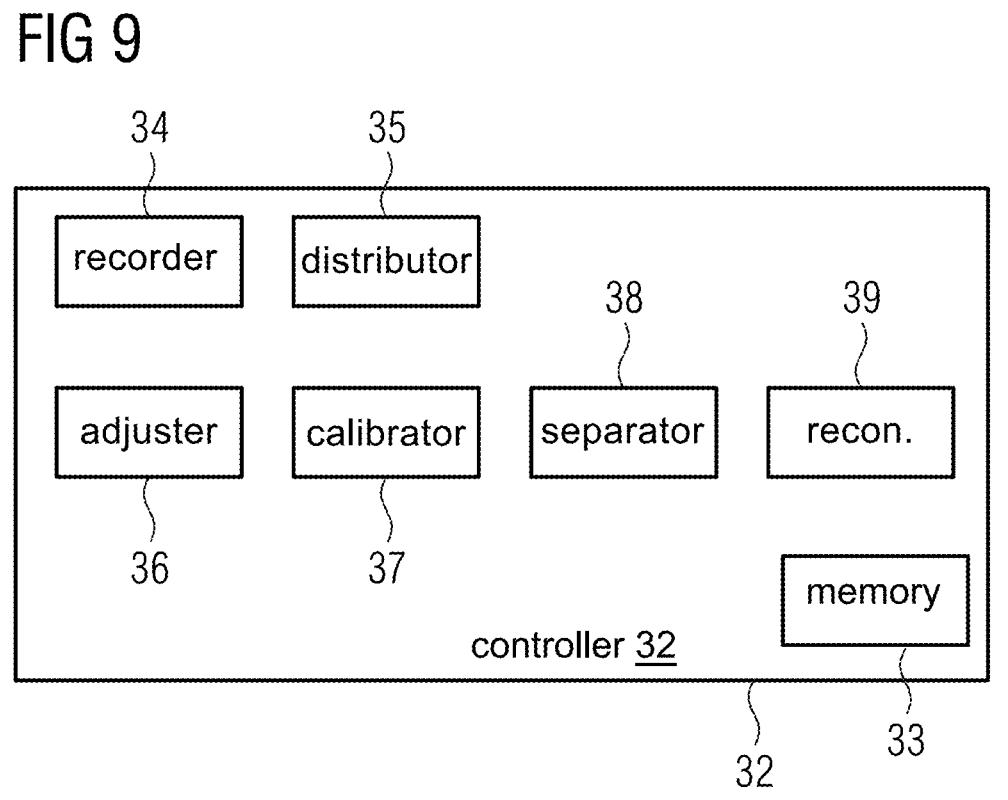

FIG. 8 shows a magnetic resonance facility 29 according to the disclosure. The facility 29 may comprise a main magnet unit 30 which comprises a main magnet for generating the main magnet field and a cylindrical patient receiving space 31 into which a patient can be moved by means of a patient support (not shown) for examination. A gradient coil arrangement and a radiofrequency coil arrangement can be provided surrounding the patient receiving space 31. The operation of the magnetic resonance facility 29 may be controlled by way of a controller 32, which is illustrated in greater detail in FIG. 9.

The controller 32 may include a memory storage means (memory) 33 in which a wide variety of information, for example, slice scan data, reference data, single slice scan data, calibration data and suchlike can be stored. A recording unit (recorder) 34 which can also be designated a sequence unit, controls the recording operation of the magnetic resonance facility 29 in general and is, in particular, also configured to carry out the steps S2 to S5 of the method according to the disclosure. A distribution unit (distributor) 35 can carry out the distribution of the slice stack into groups according to step S1 in advance.

In an adjustment unit (adjuster) 36, the intensity adjustment of the reference data sets according to step S6 takes place. In a calibration unit (calibrator) 37, the calibration data can then be established from the reference data according to step S7, after which, in a separating unit (separator) 38, the separation of slice scan data sets into single slice scan data sets can take place (see step S8). In a reconstruction unit (reconstructor) 39, image data can be reconstructed from k-space data, in particular also from single slice scan data sets according to step S9. In an exemplary embodiment, the controller 32 may include processing circuitry that is configured to perform one or more functions of the controller 32. One or more components of the controller may include processing circuitry that is configured to perform one or more respective functions of the component(s).

Although the disclosure has been illustrated and described in detail by way of the preferred exemplary embodiment, the disclosure is not restricted by the examples disclosed and other variations can be derived therefrom by a person skilled in the art without departing from the protective scope of the disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have"

and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

The various components described herein may be referred to as "modules," "units," or "devices." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such modules, units, or devices, as applicable and relevant, may alternatively be referred to herein as "circuitry," "controllers," "processors," or "processing circuitry," or alternatively as noted herein.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A computer-implemented method for operating a magnetic resonance facility for recording a magnetic resonance data set of an examination region of an examination object subdivided into slices of a slice stack using a parallel recording technique, slices of the slice stack following one another in an arrangement direction in a spatial sequence, the method comprising:

distributing the slice stack into groups, each having a same number of at least two non-overlapping slices; and for each group:

simultaneously exciting the at least two non-overlapping slices of the group using a multiband excitation pulse, recording, as a slice scan data set, magnetic resonance signals that are generated by the multiband excitation pulse from the at least two non-overlapping slices of the group, separately recording, following the recording of the slice scan data set, reference data of the at least two non-overlapping slices of the group in a recording procedure, wherein a central region of k-space filled by the slice scan data and the reference data is completely sampled, and, between the recording of the slice scan data of the slice scan data set and the recording of its associated reference data, no scan data is recorded from slices which are not included in the at least two non-overlapping slices of the slice scan data set, establishing calibration data from the reference data, separating, using the calibration data, the slice scan data into single slice scan data sets of the at least two non-overlapping slices of the group, and reconstructing image data of the magnetic resonance data set from the single slice scan data sets, wherein:

for the recording of the reference data for each slice of a group, a different time portion of the recording procedure is used, the time portions having different temporal spacings from the multiband excitation pulse, and after the recording of all the reference data, before the establishment of the calibration data, an intensity adjustment of the reference data with respect to the different position of the time portions relative to the multiband excitation pulse takes place, by:

establishing a representative intensity value for each reference data set of a slice, forming an intensity progression for each time portion from the intensity values of the reference data sets recorded in the time portion, establishing a scaling of the intensity progressions relative to one another, and performing the intensity adjustment based on the scaling.

2. A controller for a magnetic resonance facility, the controller comprising:

a distribution unit adapted to distribute, into groups, a slice stack of slices which cover an examination region of an examination object, each group having a same number of at least two non-overlapping slices, wherein in the slice stack, the slices follow one another in a spatial sequence in an arrangement direction, a recording unit adapted to:

simultaneously excite the at least two slices of the group using a multiband excitation pulse, record the magnetic resonance signals that are generated by the multiband excitation pulse, from the at least two slices of the group as a slice scan data set, and separately record, following the recording of the slice scan data set, reference data of the at least two slices of the group in a recording procedure, wherein a central region of k-space filled by the slice scan data and the reference data is completely sampled, and, between the recording of the slice scan data of the slice scan data set and the recording of its associated reference data, no scan data is recorded from slices which are not included in the at least two slices of the slice scan data set, and wherein, for the recording of the reference data for each slice of a group, a different time portion of the recording procedure is used, the time portions having different temporal spacings from the multiband excitation pulse, an adjustment unit adapted to adjust an intensity of the reference data with regard to the different position of the time portions in relation to the multiband excitation pulse, by:

establishing a representative intensity value for each reference data set of a slice, forming an intensity progression for each time portion from the intensity values of the reference data sets recorded in the time portion, establishing a scaling of the intensity progressions relative to one another, and performing the intensity adjustment based on the scaling, a calibrating unit adapted to establish calibration data from the reference data, a separating unit adapted to separate, using the calibration data, the slice scan data into single slice scan data sets of the at least two slices of the group, and a reconstruction unit adapted to reconstruct image data of the magnetic resonance data set from the single slice scan data sets.

3. The method as claimed in claim 1, wherein, for intensity adjustment, a scaling factor for reference data sets that are to be adapted is established.

4. The method as claimed in claim 1, wherein the intensity progressions are fitted to one another leaving out the zero-order fit parameter for establishing an item of fit information describing the scaling.

5. The method as claimed in claim 1, wherein the representative intensity value is established by way of averaging at least a part of the reference data of the respective reference data set.

6. The method as claimed in claim 1, wherein an at least best-possible uniform distribution of the representative intensity values in the arrangement direction is generated over the slice stack by, for at least a pair of groups, an assignment of a temporal sequence of the recording of their reference data to their spatial sequence being selected to be different.

7. The method as claimed in claim 1, wherein the distributing the slice stack into groups comprises:

performing an even distribution of the slice stack into a number of coherent stack portions corresponding to the number of slices to be excited simultaneously; and forming the groups according to the spatial sequence in the stack portions progressively with respectively one slice from each stack portion, wherein for establishing a temporal sequence of the recording of the reference data, the slices of the stack portions are evenly distributed over the time portions.

8. The method as claimed in claim 1, wherein the slice scan data are recorded in a single-shot technique.

9. A non-transitory computer-readable storage medium with an executable program stored thereon, that when executed, instructs a processor to perform the method of claim 1.

10. A magnetic resonance facility comprising the controller of claim 2.

11. The method as claimed in claim 4, wherein, before the fitting, an item of intensity jump information describing intensity jumps along the arrangement direction is established from the slice scan data and is taken into account during the fitting.

12. The method as claimed in claim 7, wherein, with two slices to be excited simultaneously in each case:

for an odd number of groups, inverted temporal sequences are selected for groups containing slices that are spatially directly adjacent in each case, with regard to the stack portions, and given an even number of groups, the temporal sequences are selected so that two slices with the same time portion of the recording of the reference data are situated in the middle of the slice stack.

13. The method as claimed in claim 8, wherein a Half-Fourier Acquisition Single-Shot Turbo Spin Echo (HASTE) technique is used as the single-shot technique.

* * * * *